United States Patent
Hsu et al.

(10) Patent No.: US 9,462,713 B2
(45) Date of Patent: Oct. 4, 2016

(54) TRANSMISSION DEVICE APPLIED TO PIVOT SHAFT MECHANISM

(71) Applicant: FIRST DOME CORPORATION, New Taipei (TW)

(72) Inventors: An Szu Hsu, New Taipei (TW); Wang Jui Lee, New Taipei (TW); Chung Yi Lin, New Taipei (TW); Ya Ching Lin, New Taipei (TW)

(73) Assignee: First Dome Corporation, New Taipei (TW)

( * ) Notice: Subject to any disclaimer, the term of this patent is extended or adjusted under 35 U.S.C. 154(b) by 83 days.

(21) Appl. No.: 14/516,846

(22) Filed: Oct. 17, 2014

(65) Prior Publication Data

US 2016/0047156 A1 Feb. 18, 2016

(30) Foreign Application Priority Data

Aug. 13, 2014 (TW) .............................. 103127703 A

(51) Int. Cl.
*H05K 5/02* (2006.01)
*F16H 21/44* (2006.01)
*G06F 1/18* (2006.01)

(52) U.S. Cl.
CPC ............ *H05K 5/0226* (2013.01); *F16H 21/44* (2013.01); *G06F 1/18* (2013.01); *E05Y 2900/606* (2013.01); *Y10T 16/547* (2015.01)

(58) Field of Classification Search
CPC ............... Y10T 16/547; Y10T 16/533; Y10T 16/5478; Y10T 16/5387; Y10T 16/540255; Y10T 16/540345; Y10T 16/5325; E05Y 2900/606; H04M 1/022; E05F 1/1207; E05D 3/06; E05D 11/0054; E05D 3/12; E05D 5/10; E05D 2005/122; E05D 2011/0072; E05D 2005/106; F16H 21/44; H05K 5/0226; G06F 1/1616; G06F 1/1618; G06F 1/1681; G06F 1/18
USPC ......... 16/366, 250, 371, 303, 330, 340, 244; 455/575.3; 361/679.27; 379/433.13
See application file for complete search history.

(56) References Cited

U.S. PATENT DOCUMENTS

| | | | | |
|---|---|---|---|---|
| 8,272,104 | B2* | 9/2012 | Chen | G06F 1/1616 16/327 |
| 8,615,848 | B2* | 12/2013 | Mitsui | H04M 1/022 16/354 |
| 8,776,319 | B1* | 7/2014 | Chang | G06F 1/1681 16/303 |
| 8,904,601 | B2* | 12/2014 | Hsu | H04M 1/0216 16/366 |
| 8,914,946 | B2* | 12/2014 | Hsu | F16H 21/44 16/342 |
| 8,959,720 | B2* | 2/2015 | Hsu | G06F 1/1681 16/303 |
| 9,003,606 | B2* | 4/2015 | Hsu | G06F 1/1681 16/366 |
| 9,003,607 | B1* | 4/2015 | Hsu | F16H 21/44 16/366 |
| 9,274,566 | B1* | 3/2016 | Horng | G06F 1/1681 |
| 2009/0227301 | A1* | 9/2009 | Lindvall | G06F 1/1616 455/575.4 |
| 2009/0241292 | A1* | 10/2009 | Wang | E05D 3/183 16/387 |
| 2015/0013107 | A1* | 1/2015 | Shin | E05D 3/06 16/366 |
| 2015/0173218 | A1* | 6/2015 | Hsu | E05D 3/12 16/366 |
| 2015/0189777 | A1* | 7/2015 | Hsu | H05K 5/0226 16/366 |
| 2015/0327383 | A1* | 11/2015 | Hsu | H05K 5/0226 16/366 |
| 2016/0048175 | A1* | 2/2016 | Hsu | G06F 1/1681 16/244 |

* cited by examiner

*Primary Examiner* — William Miller
(74) *Attorney, Agent, or Firm* — Rosenberg, Klein & Lee

(57) ABSTRACT

A transmission device applied to a pivot shaft mechanism provides a security system and is easy to assemble. The transmission device includes at least one rotary shaft, a drive section movable with the rotation of the rotary shaft, a driver (transversely) reciprocally movable and a turning unit having a first end connected with the driver and a second end assembled with a carrier body. The driver includes an arm section provided with an elastic body and a hand section connected with the arm section. When the driver is transversely moved, the turning unit is swung, whereby the second end of the turning unit drives the carrier body for lifting or lowering a substrate body or a frame in accordance with the operation mode of an electronic apparatus.

28 Claims, 9 Drawing Sheets

TRANSMISSION DEVICE APPLIED TO PIVOT SHAFT MECHANISM

BACKGROUND OF THE INVENTION

1. Field of the Invention

The present invention relates generally to a transmission device applied to pivot shaft mechanism, and more particularly to a pivot shaft transmission device including at least one rotary shaft, a drive section, a driver equipped with an elastic body, and a turning unit. When the turning unit is swung, a carrier body is driven to lift or lower a substrate body.

2. Description of the Related Art

There are various electronic apparatuses provided with covers or display screens, such as mobile phones, notebooks, PDA, and electronic books. The covers or display screens are pivotally mounted on the electronic apparatuses via pivot pins or rotary shafts, whereby the covers or display screens can be freely rotated and opened/closed under external force.

In order to operate the display module (such as the screen) and/or the apparatus body module of the electronic apparatus in more operation modes and application ranges, a conventional transmission device has been developed to lift or lower a frame in rotation of the display module and/or the apparatus body module so as to protect and prevent the keyboard disposed on the apparatus body module from being mis-touched. FIG. 1 shows the conventional transmission device.

As shown in FIG. 1, a (dual) rotary shaft B and a case C enclosing the rotary shaft B are mounted on the apparatus body module A1 of an electronic apparatus A. The rotary shaft B has an eccentric section B1, which is eccentrically rotatable with the rotation of the rotary shaft. A transmission support B2 is connected with the eccentric section B1 and assembled with a carrier body B4 via a connection section B3. When a user operates the display module or the apparatus body module A1 to rotate and open the display module by 180 degrees to 360 degrees for use as a tablet, the eccentric section B1 of the rotary shaft pushes the transmission support B2 to make the connection section B3 and the carrier body B4 (longitudinally) move. At this time, the carrier body B4 pushes a frame A2 disposed on the apparatus body module A1 to lift or lower the frame A2. When lifted, the height of the frame A2 is higher than that of the keyboard A3 to serve as a support for the electronic apparatus. Also, the frame serves to protect and prevent the keyboard A3 disposed on the apparatus body module A1 from being mis-touched.

With respect to the operation and structural design of the above transmission device, in order to drivingly connect the transmission support B2 with the eccentric section B1 of the rotary shaft, the case C must be formed with a notch C1 for the transmission support B2 to pass and move through. Obviously, the notch C1 will affect the entire appearance and visual design of the electronic apparatus A. Moreover, dust or the like is apt to accumulate on the components inside the case C. This is not what we expect.

With respect to the assembling process and structural design of the above transmission device, the connection section B3 must be provided with a claw section B5 for latching with the transmission support B2. Also, a base support A4 is disposed under bottom of the apparatus body module A1 is provided with an L-shaped restriction plate A5. The restriction plate A5 is assembled with the protrusion section B6 formed on the connection section B3, whereby the connection section B3 is restricted on the base support A4 and movable with the transmission support B2. As well known by those who are skilled in this field, the cooperative structures between the transmission support B2, the connection section B3 and the base support A4 are relatively complicated. As a result, it is difficult and troublesome to assemble these components.

The conventional pivot shaft transmission device and the relevant connection components thereof have some shortcomings in use and structural design that need to be overcome. It is therefore tried by the applicant to provide a pivot shaft transmission device to eliminate the shortcomings existing in the conventional pivot shaft transmission device so as to widen the application range and facilitate the assembling process of the pivot shaft transmission device. For example, in comparison with the conventional transmission device, the pivot shaft transmission device of the present invention is applicable to notebook computer or small-size electronic apparatus to meet the requirements of lightweight and thin design. The pivot shaft transmission device of the present invention provides a security system and keeps the case enclosing the rotary shaft complete. This overcomes the problems of the conventional transmission device that the entire appearance and visual design of the electronic apparatus are affected and dust or the like is apt to accumulate on the components inside the case. In addition, the present invention solves the problems of the conventional transmission device that the cooperative structures are relatively complicated so that it is difficult and troublesome to assemble these components.

SUMMARY OF THE INVENTION

It is therefore a primary object of the present invention to provide a transmission device applied to pivot shaft mechanism, which provides a security system and is easy to assemble. The transmission device includes at least one rotary shaft, a drive section movable with the rotation of the rotary shaft, a driver (transversely) reciprocally movable and a turning unit having a first end connected with the driver and a second end assembled with a carrier body. The driver includes an arm section provided with an elastic body and a hand section connected with the arm section. When the driver is transversely moved, the turning unit is swung, whereby the second end of the turning unit drives the carrier body for lifting or lowering a substrate body or a frame in accordance with the operation mode of an electronic apparatus.

In the above transmission device, the rotary shaft includes a pivoted section assembled with a torque module and a fixed section connected with an apparatus body module or a display module. The drive section is disposed on the rotary shaft between the pivoted section and the fixed section. The driver is formed with a guide section corresponding to the drive section. The guide section is assembled with the drive section, whereby the guide section is movable with the rotation of the drive section to drive the driver to move.

In the above transmission device, the rotary shaft includes a first rotary shaft and a second rotary shaft. The first rotary shaft is pivotally connected with the apparatus body module of the electronic apparatus, while the second rotary shaft is pivotally connected with the display module of the electronic apparatus. A link unit is disposed between the first and second rotary shafts for synchronously rotating the first and second rotary shafts.

In the above transmission device, the arm section of the driver is formed with a guide rail. The first end of the turning unit is pivotally connected on the guide rail via a bolt, whereby the first end of the turning unit is movable along the guide rail. The elastic body has two ends. One end is affixed to the arm section of the driver. The other end is pivotally connected with the first end of the turning unit via the bolt to provide an elastic motional range for the turning unit.

During the process that the transmission unit pulls the connection section and the carrier body to lift the frame, incase the substrate body or the frame is hindered from being lifted or lowered due to external force or mis-operation, the driver or the first end of the turning unit can extend the elastic body to avoid damage of the transmission device due to external force.

The present invention can be best understood through the following description and accompanying drawings, wherein:

DETAILED DESCRIPTION OF THE PREFERRED EMBODIMENTS

Figure 1:
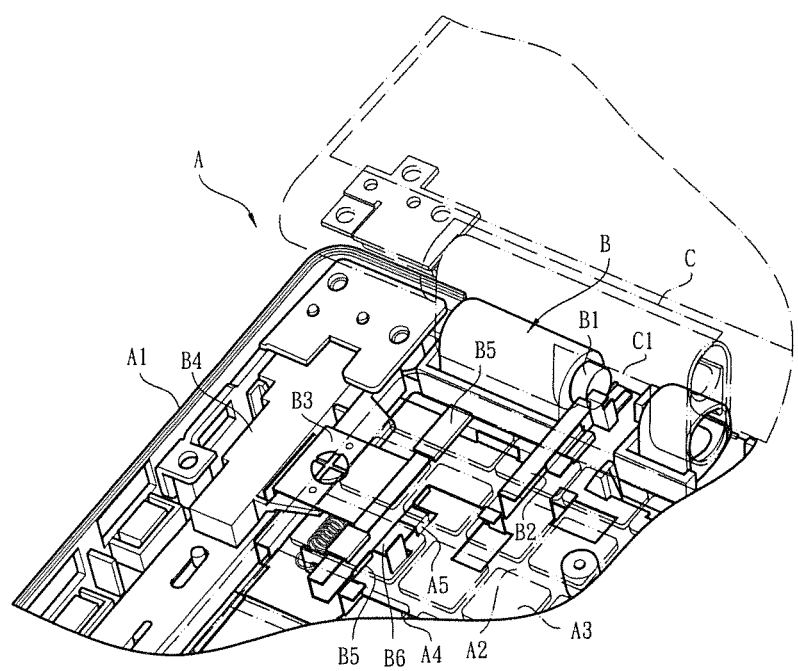
FIG. 1 is a perspective view of a conventional pivot shaft transmission device, in which the phantom lines show that a keyboard is positioned on a base support.
Figure 2:
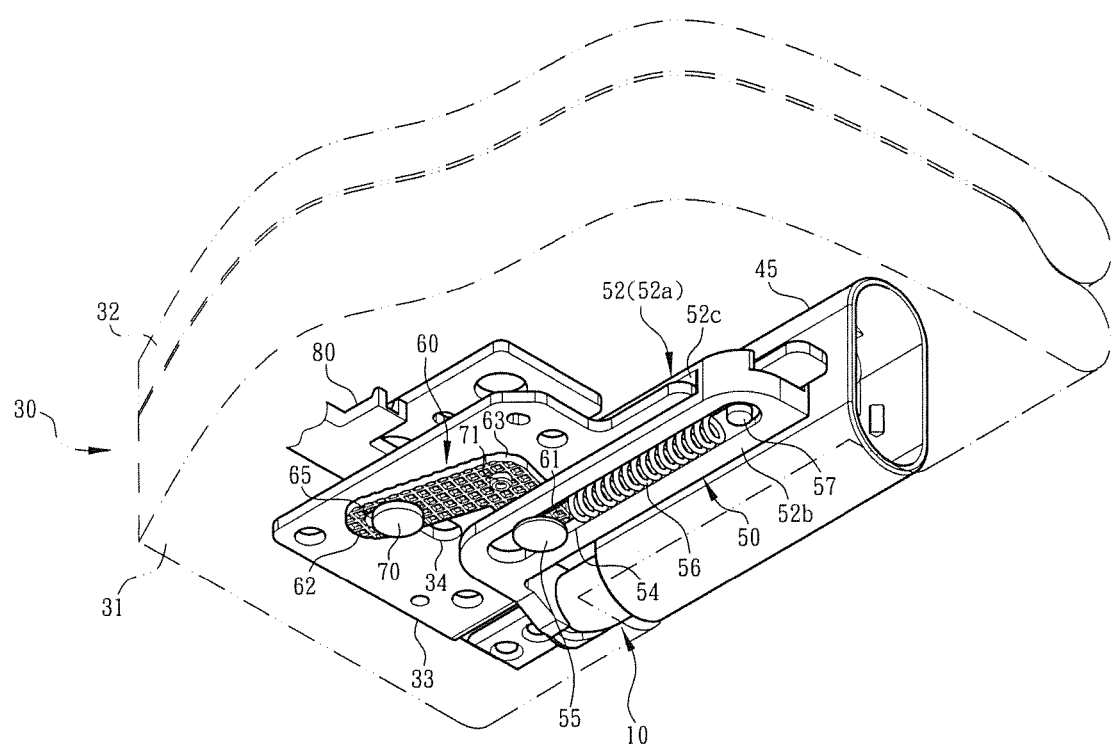
FIG. 2 is a perspective assembled view of the present invention, showing the cooperative structures of the first and second shafts, the driver, the elastic body and the turning unit.
Figure 3:
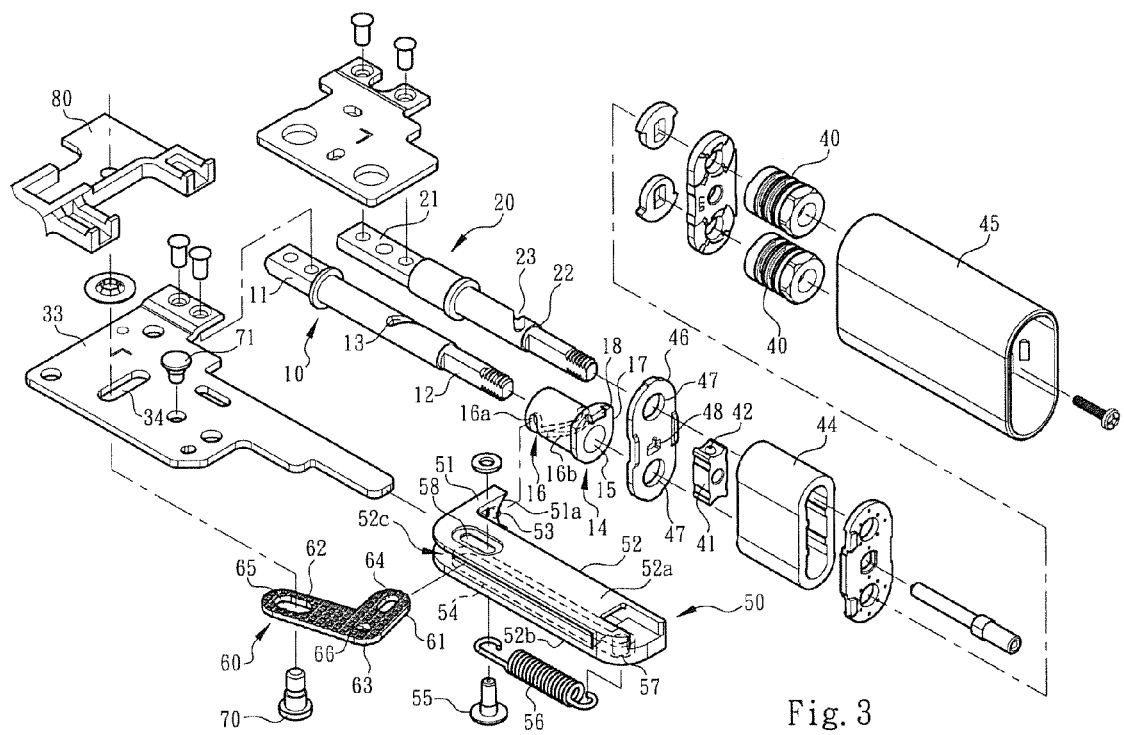
FIG. 3 is a perspective exploded view of the present invention, showing the cooperative structures of the first and second shafts, the drive section, the driver, the turning unit and the carrier body.

Please refer to FIGS. 2 and 3. The transmission device applied to pivot shaft mechanism of the present invention has a dual-shaft mechanism assembled with an electronic apparatus (such as a computer) for illustration. The pivot shaft transmission device includes a first rotary shaft 10 and a second rotary shaft 20. Each of the first and second rotary shafts 10, 20 has a fixed section 11, 21 and a pivoted section 12, 22. The fixed section 11 of the first rotary shaft 10 is connected with an apparatus body module 31 of an electronic apparatus 30 or connected with a fixing plate 33 of the apparatus body module 31. The fixed section 21 of the second rotary shaft 20 is connected with a display module 32 of the electronic apparatus 30. The pivoted sections 12, 22 of the first and second rotary shafts 10, 20 are (respectively) assembled with torque modules 40. Accordingly, when the action force applied to the apparatus body module 31 or the display module 32 by a user for rotating the same disappears, the apparatus body module 31 or the display module 32 are immediately located. The torque modules 40 pertain to prior art and thus will not be further described hereinafter.

In this embodiment, a link unit 41 is disposed between the first and second rotary shafts 10, 20 for synchronously rotating the first and second rotary shafts 10, 20. To speak more specifically, a section of each of the first and second rotary shafts 10, 20 in adjacency to the pivoted section 12, 22 is formed with a spiral groove 13, 23. Protrusion sections 42 are disposed at two ends of the link unit 41 corresponding to the spiral grooves 13, 23. The protrusion sections 42 are respectively inlaid in the spiral grooves 13, 23. Accordingly, when a user operates and rotates the display module 32, the second rotary shaft 20 is driven to rotate. At the same time, the link unit 41 is forced to drive the first rotary shaft 10 and the apparatus body module 31 to rotate.

As shown in the drawings, a subsidiary case 44 encloses the spiral grooves 13, 23 of the first and second rotary shafts 10, 20 and the link unit 41. The subsidiary case 44 together with a restriction plate 46 and the torque modules 40 is installed in a case 45. The restriction plate 46 is formed with two holes 47 for the pivoted sections 12, 22 of the first and second rotary shafts 10, 20 to pass through respectively. After the pivoted sections 12, 22 pass through the subsidiary case 44, the pivoted sections 12, 22 are assembled with the torque modules 40.

In this embodiment, a drive section 14 is disposed between the fixed section 11 and the pivoted section 12 of the first rotary shaft 10. The drive section 14 is a tubular body having a shaft hole 15 in which the first rotary shaft 10 is fitted. A driving section 16 is formed on the surface of the drive section 14. The driving section 16 is a rail or groove structure including an (annular) straight section 16a and a (spiral) oblique section 16b connected with the straight section 16a.

As shown in FIG. 3, one end of the drive section 14 is provided with a shoulder section 17 and an insertion block 18 formed on the shoulder section 17. The insertion block 18 is inlaid in a hole 48 formed on the restriction plate 46. Therefore, when a user operates and rotates the display module 32 and the second rotary shaft 20, the link unit 41 is forced to drive the first rotary shaft 10 and the apparatus body module 31 to rotate. At the same time, the case 45 and the restriction plate 46 also drive the drive section 14 to rotate.

FIG. 3 also shows that a reciprocally movable driver 50 is assembled with the driving section 16 of the drive section 14. In this embodiment, the driver 50 includes a hand section 51 and an arm section 52 connected with the hand section 51. The hand section 51 and the arm section 52 together form an L-shaped structure. The hand section 51 is formed with an arched section 51a corresponding to the tubular body of the drive section 14 and a guide section 53 disposed on the arched section 51a. The guide section 53 has the form of a key and is inlaid in the driving section 16. When the apparatus body module 31 and the display module 32 are positioned in the closed position, the guide section 53 is positioned in a start point of the straight section 16a of the driving section. Therefore, the end point of the straight section 16a means the junction between the straight section 16a and the oblique section 16b.

As shown in the drawings, the arm section 52 of the driver is partially or totally a double-layered structure having a first section 52a, a second section 52b and a space or cavity 52c formed between the first and second sections 52a, 52b. The arm section 52 of the second section 52b is formed with a receptacle 54 for receiving therein an elastic body 56. The elastic body 56 is a spiral spring having two ends. One end of the elastic body 56 is affixed to a boss 57 of the arm section 52 (or the receptacle 54). The other end of the elastic body 56 is pivotally connected with the arm section 52 and a turning unit 60 via a bolt 55. The elastic body 56 provides an elastic motional range for the turning unit 60.

To speak more specifically, the other side of the arm section 52 (or the first section 52a) is formed with a slot-shaped guide rail 58 opposite to the boss 57. The guide rail 58 communicates with the cavity 52c and the receptacle 54. The turning unit 60 is an L-shaped board body having a first end 61, a second end 62 and a middle section 63 connected between the first and second ends 61, 62. The first end 61 of the turning unit extends into the cavity 52c. The first end 61 is formed with an assembling hole 64. The bolt 55 is passed through the assembling hole 64 to pivotally connect the first end 61 (or the assembling hole 64) and the other end of the elastic body 56 on the guide rail 58. The elastic body 56 is preset with an elastic force. In case an external force is greater than the preset force, the elastic body 56 permits the turning unit 60 or the first end 61 to move along the guide rail 58. (This will be further described hereinafter).

In this embodiment, the second end 62 of the turning unit 60 is formed with an assembling hole 65. A fixing unit 70 is passed through the assembling hole 65 to pivotally connect the second end 62 on a slot-shaped rail 34 of the fixing plate 33. The middle section 63 is formed with an assembling hole 66. A fixing bolt 71 is passed through the assembling hole 66 to pivotally connect the middle section 63 on the fixing plate 33 of the apparatus body module 31 as a rotational fulcrum or swinging fulcrum. Therefore, the turning unit 60 is swingable with the move of the driver 50 to make the second end 62 move along the rail 34.

To speak more specifically, the position where the first end 61 of the turning unit 60 and the bolt 55 are initially assembled on the guide rail 58 is defined as a first position. The position to which the first end 61 and the bolt 55 are moved is defined as a second position. The position where the second end 62 of the turning unit 60 and the fixing unit 70 are assembled on the rail 34 is defined as a start position. The position to which the second end 62 and the fixing unit 70 are moved with the move of the driver 50 toward the other end of the rail 34 is defined as an end position.

It should be noted that with the axis of the rail 34 serving as a reference axis, the moving direction of the second end 62 of the turning unit 60 and the fixing unit 70 along the rail 34 is defined as a longitudinal move. Accordingly, the moving direction normal to the longitudinal move is defined as a transverse move. In this embodiment, the axial direction of the guide rail 58 is normal the axial direction of the rail 34. Therefore, the first end 61 of the turning unit and the bolt 55 move along the guide rail 58 in a transverse direction.

Figure 4:
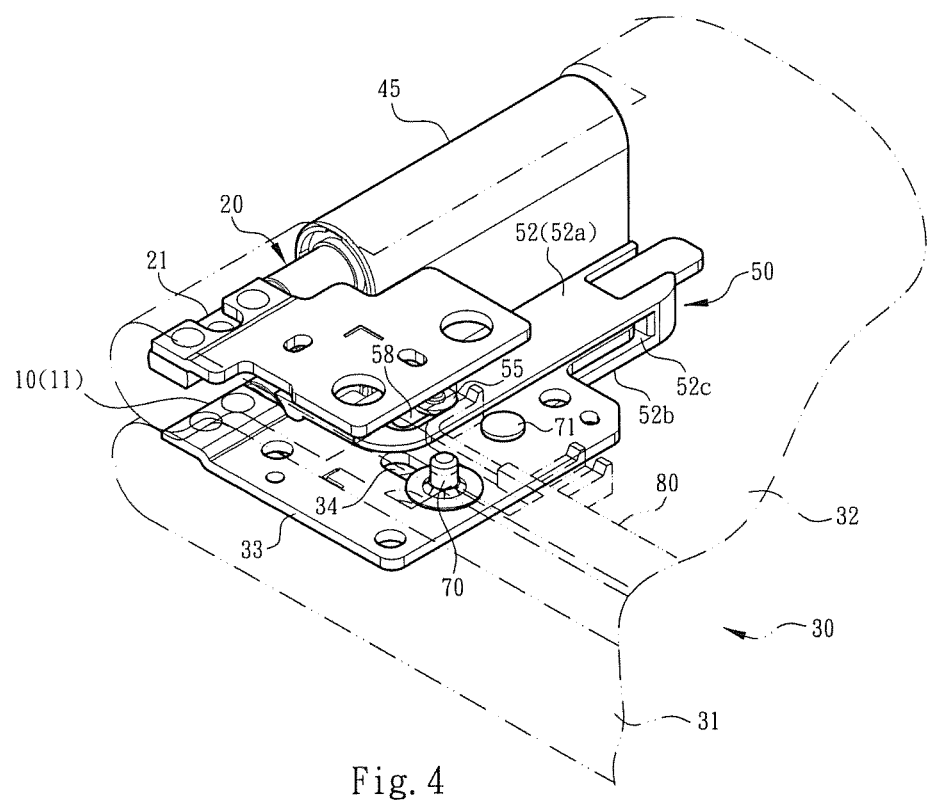
FIG. 4 is a perspective assembled view of the present invention, in which the phantom lines show that the display module is closed onto the apparatus body module and show the cooperative structures of the transmission device.
Figure 5:
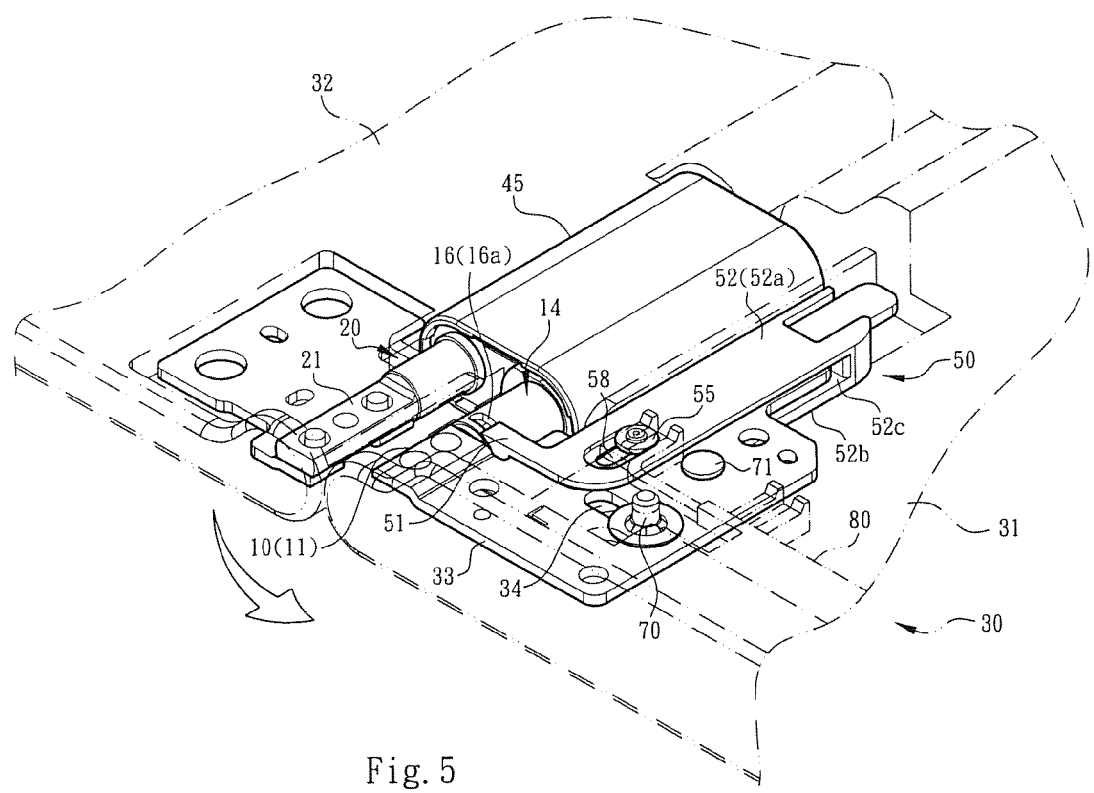
FIG. 5 is a perspective assembled view of the present invention, showing that the first and second rotary shafts are respectively rotated by 90 degrees and the apparatus body module and the display module are 180-degree opened and showing the cooperative structures of the rotary shafts, the drive section and the driver.
Figure 6:
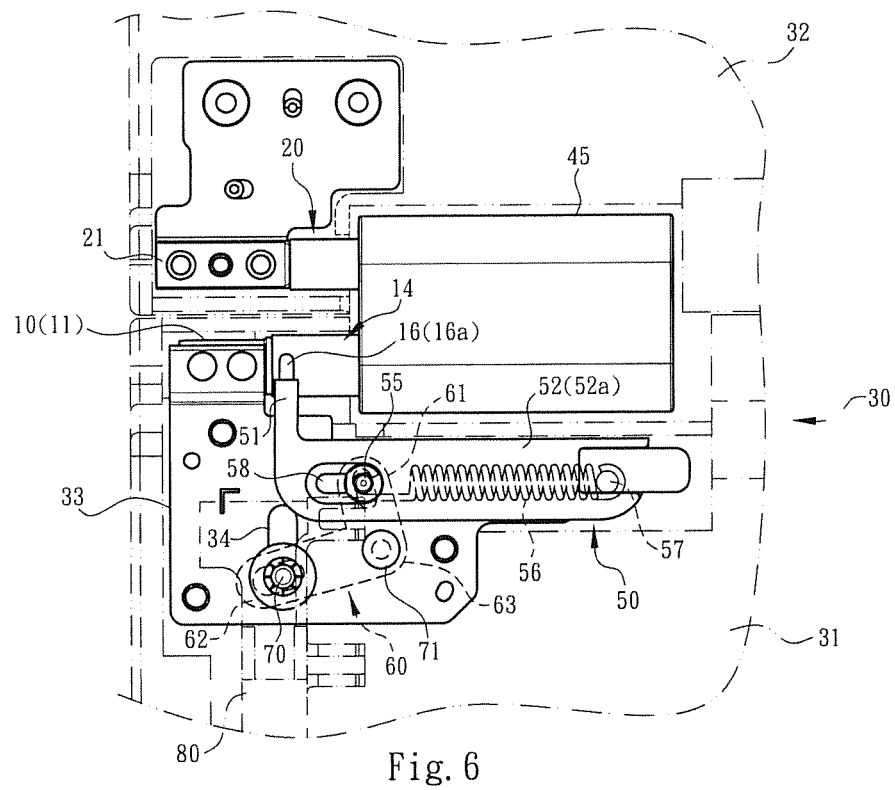
FIG. 6 is a plane view according to FIG. 5, showing the cooperative structures of the rotary shafts, the drive section, the driver, the elastic body and the turning unit.

As shown in the drawings, the second end 62 of the turning unit 60 is pivotally connected with a carrier body 80 via the fixing unit 70. The carrier body 80 is disposed on the apparatus body module 31 for pushing a substrate body or a frame to ascend/descend (not shown) as in the conventional technique Please refer to FIGS. 4, 5 and 6. FIG. 4 shows that the apparatus body module 31 and the display module 32 are positioned in the closed position and the guide section 53 is positioned in the start point of the straight section 16a of the driving section 16. As shown in FIGS. 5 and 6, when a user operates the display module 32 and the second rotary shaft 20 to rotate by 90 degrees, the apparatus body module 31 and the first rotary shaft 10 are also relatively rotated by 90 degrees. At the same time, the case 45 and the restriction plate 46 drive the drive section 14 to rotate on the first rotary shaft 10. Therefore, the guide section 53 of the driver 50 is relatively moved to the end point of the straight section 16a of the driving section 16. At this time, the first end 61 of the turning unit 60 and the bolt 55 are still positioned in the first position of the guide rail 58 and the second end 62 and the fixing unit 70 are still positioned in the start position of the rail 34.

Figure 7:
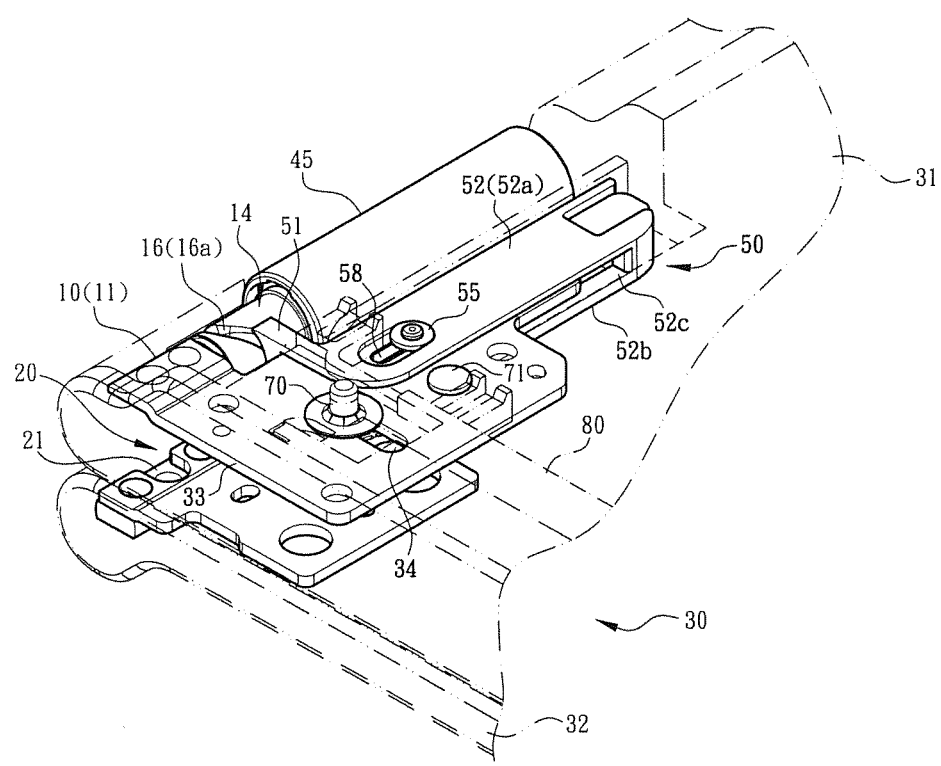
FIG. 7 is another perspective assembled view of the present invention, showing that the first and second rotary shafts are respectively rotated by 180 degrees and the apparatus body module and the display module are 360-degree opened and showing the cooperative structures of the drive section and the driver.
Figure 8:
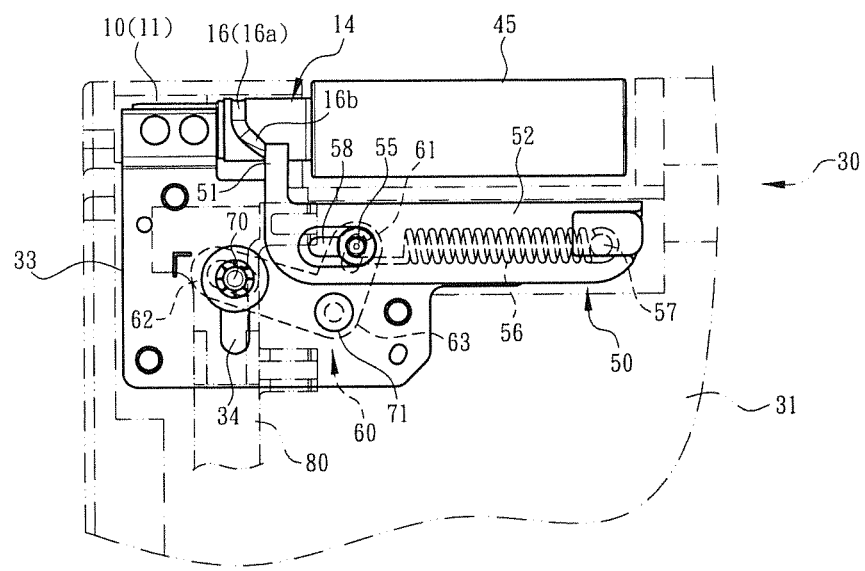
FIG. 8 is a plane view according to FIG. 7, showing the cooperative structures of the rotary shafts, the drive section, the driver, the elastic body and the turning unit.

Please refer to FIGS. 7 and 8, which show that the user operates the display module 32 and the second rotary shaft 20 to rotate by 180 degrees and the apparatus body module 31 and the first rotary shaft 10 are also relatively rotated by 180 degrees. At the same time, the case 45 and the restriction plate 46 drive the drive section 14 to rotate on the first rotary shaft 10. Therefore, the guide section 53 of the driver 50 is relatively moved from the end point of the straight section 16a of the driving section into the oblique section 16b or to the end point of the oblique section 16b. Accordingly, the arm section 52 of the driver 50 (and the elastic body 56) are transversely moved, whereby the turning unit 60 is rotated or swung around the assembling hole 66 of the middle section 63 and the fixing bolt 71 and the second end 62 is longitudinally moved along the rail 34 from the start position to the end position (upper side of the drawing). Accordingly, the carrier body 80 is pulled to move to the upper side of the drawing so as to push and lift the substrate body or the frame to a highest position, which is higher than the position of the keyboard. Under such circumstance, the frame serves as a support for bearing the electronic apparatus. Moreover, the frame serves to protect and prevent the keyboard disposed on the apparatus body module from being mistouched.

Figure 9:
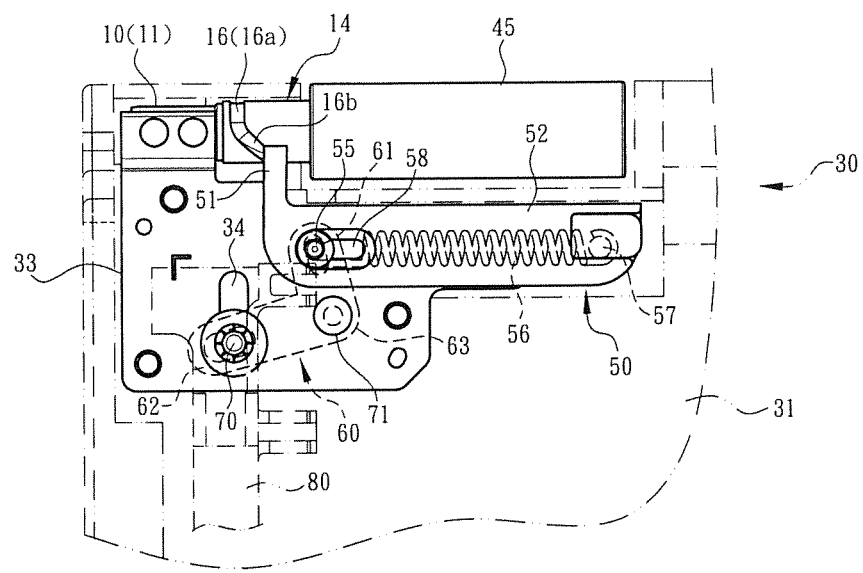
FIG. 9 is a plane view according to FIG. 8, showing that the carrier body is hindered from moving by external force and the first end of the turning unit extends the elastic body.

Please refer to FIG. 9. It should be noted that during the process that the turning unit 60 pulls the carrier body 80, in case the operator mis-presses the frame and fails to smoothly lift the frame and the mis-press force is greater than the preset elastic force of the elastic body 56, the turning unit 60 will be unable to swing with the move of the driver 50. Under such circumstance, along with the move of the driver 50, the first end 61 of the turning unit 60 moves toward the second position of the guide rail 58 and the boss 57 will extend the elastic body 56. The allowable extension range of the elastic body 56 should be larger than the moving distance of the driver 50 (or the moving length of the first end 61 of the turning unit 60 along the guide rail 58). That is, the elastic body 56 allows an elastic motional range between the driver 50 and the turning unit 60 to together establish a security system to prevent the transmission mechanism from being damaged by external force.

It should be noted that when the user operates the display module 32 and the second rotary shaft 20 and the apparatus body module 31 and the first rotary shaft 10 to rotate from the 180-degree position to the closed position, the case 45 and the restriction plate 46 will drive the drive section 14 to rotate on the first rotary shaft 10. Therefore, the guide section 53 of the driver 50 is relatively moved from the end point of the oblique section 16b toward the straight section 16a of the driving section. Accordingly, the driver 50 and the turning unit 60 are driven to move back to the start position. At this time, the second end 62 of the turning unit 60 pushes the carrier body 80 to move toward the lower side of the drawing back to its home position so as to lower the frame.

In comparison with the conventional device, the transmission device applied to pivot shaft mechanism of the present invention meets the requirements of lightweight and thin design and has the following advantages:

1. The pivot shaft and the relevant components have been redesigned to be different from the conventional device. Also, the use and operation mode of the pivot shaft transmission device is changed to be different from the conventional device. For example, the rotary shaft (or the first rotary shaft 10) is provided with a drive section 14 in cooperation with the driver 50 and the turning unit 60. The driver 50 is formed with a cavity 52c and a receptacle 54 for installing the elastic body 56 therein. The arm section 52 is formed with a guide rail 58 in which the first end 61 of the turning unit 60 is pivotally connected. The second end 62 of the turning unit 60 is movably assembled in the rail 34. The elastic body 56 provides an elastic motional range for the driver 50 and the turning unit 60. The second end 62 of the turning unit 60 is able to drive the carrier body 80 to move. The above arrangement overcomes the problem of the conventional device that the case cannot keep complete and must be formed with a large notch for assembling with the transmission unit. This not only affects the entire appearance and visual design of the electronic apparatus, but also makes it impossible to minify the volume of the case. As a result, dust or the like is apt to accumulate on the components inside the case to affect the transmission function.

2. The driver 50, the elastic body 56, the turning unit 60 and the carrier body 80 of the transmission device can be easily assembled. In contrast, in the conventional device, the connection section B3 is provided with a claw section B5 latched with the transmission support B2. The base support A4 of the bottom of the apparatus body module is provided with an L-shaped restriction plate A5 assembled with the protrusion section B6 of the connection section B3. Such structure is relatively complicated so that it is difficult and troublesome to assemble these components. The present invention solves these problems of the conventional device.

3. In practice, the apparatus body module 31 and the display module 32 can be equipped with one single rotary shaft assembled with the drive section 14, the driver 50 and the turning unit 60 to achieve the same transmission effect. Also, the (spiral) angle of the straight section 16a and the oblique section 16b of the driving section 16 of the drive section can be adjusted in accordance with actual requirements so as to change the operation mode and angle of the apparatus body module 31 and the display module 32 and the transmission device.

In conclusion, the transmission device applied to pivot shaft mechanism of the present invention is designed with a novel structure for effectively transmitting power and is advantageous over the conventional device.

The above embodiments are only used to illustrate the present invention, not intended to limit the scope thereof. Many modifications of the above embodiments can be made without departing from the spirit of the present invention.

What is claimed is:

1. A transmission device applied to a pivot shaft mechanism, comprising:
    at least one rotary shaft having a fixed section and a pivoted section, the pivoted section being assembled with a torque module;
    a drive section disposed on the rotary shaft, the drive section being provided with a driving section;
    a reciprocally movable driver having a hand section assembled with the driving section and an arm section connected with the hand section, the arm section being formed with a guide rail, an elastic body being disposed in the arm section; and
    a turning unit including a first end connected with the driver and the elastic body, a second end assembled with a carrier body and a middle section connected between the first and second ends, one end of the elastic body being affixed to the arm section, the other end of the elastic body and the first end of the turning unit being pivotally connected on the guide rail, whereby when the driver is moved, the turning unit is swung to make the second end of the turning unit drive the carrier body to move.

2. The transmission device applied to pivot shaft mechanism as claimed in claim 1, wherein the hand section of the driver is provided with a guide section inlaid in the driving section, the arm section of the driver being formed with a receptacle and a boss for installing the elastic body, the guide rail being disposed on the other side of the arm section opposite to the boss, the turning unit being an L-shaped plate body, each of the first end, the second end and the middle section of the turning unit being formed with an assembling hole, one end of the elastic body being affixed to the boss, the other end of the elastic body and the assembling hole of the first end of the turning unit being together pivotally connected on the guide rail of the arm section via a bolt, the assembling hole of the second end of the turning unit being pivotally connected on a rail of a fixing plate via a fixing unit, the assembling hole of the middle section of the turning unit being pivotally connected with the fixing plate via a fixing bolt as a fulcrum.

3. The transmission device applied to pivot shaft mechanism as claimed in claim 2, wherein the arm section of the driver is at least partially a double-layered structure having a first section, a second section and a cavity formed between the first and second sections, the receptacle being formed on the second section, the guide rail being a slot-shaped structure disposed on the first section in communication with the cavity and the receptacle, the first end of the turning unit extending into the cavity, the rail of the fixing plate being a slot-shaped structure, whereby the second end of the turning unit is movable along the rail, the axial direction of the guide rail being normal to the axial direction of the rail.

4. The transmission device applied to pivot shaft mechanism as claimed in claim 3, wherein the elastic body is a spiral spring, the hand section and the arm section of the reciprocally movable driver together define an L-shaped contour, the carrier body being disposed on an apparatus body module of an electronic apparatus.

5. The transmission device applied to pivot shaft mechanism as claimed in claim 4, wherein the drive section is a tubular body having a shaft hole in which the at least one rotary shaft is fitted, the driving section being formed on a surface of the drive section, the driving section being a groove structure including a straight section and an oblique section connected with the straight section.

6. The transmission device applied to pivot shaft mechanism as claimed in claim 3, wherein one of the boss and the first end of the turning unit extends the elastic body, an allowable extension range of the elastic body being larger than a moving length by which the first end of the turning unit moves along the guide rail.

7. The transmission device applied to pivot shaft mechanism as claimed in claim 6, wherein the drive section is a tubular body having a shaft hole in which the at least one rotary shaft is fitted, the driving section being formed on a surface of the drive section, the driving section being a groove structure including a straight section and an oblique section connected with the straight section.

8. The transmission device applied to pivot shaft mechanism as claimed in claim 3, wherein the rotary shaft is disposed on an electronic apparatus, the electronic apparatus including an apparatus body module and a display module, the fixing plate being disposed on the apparatus body module, the rotary shaft including a first rotary shaft and a second rotary shaft, the fixed section of the first rotary shaft being connected with and disposed on the fixing plate of the apparatus body module, the fixed section of the second rotary shaft being connected with and disposed on the display module, the drive section being disposed on the first rotary shaft, the first and second rotary shafts being enclosed in a subsidiary case, the subsidiary case together with a restriction plate and torque modules being installed in a case, the restriction plate being formed with two holes for the pivoted sections of the first and second rotary shafts to pass through respectively.

9. The transmission device applied to pivot shaft mechanism as claimed in claim 8, wherein a link unit is disposed between the first and second rotary shafts for synchronously rotating the first and second rotary shafts, a section of each of the first and second rotary shafts in adjacency to the pivoted section being formed with a spiral groove, protrusion sections being disposed at two ends of the link unit corresponding to the spiral grooves, the protrusion sections being respectively inlaid in the spiral grooves.

10. The transmission device applied to pivot shaft mechanism as claimed in claim 8, wherein the drive section is a tubular body having a shaft hole in which the first rotary shaft is fitted, the driving section being formed on a surface of the drive section, the driving section being a groove structure including a straight section and an oblique section connected with the straight section, one end of the drive section being provided with a shoulder section and an insertion block formed on the shoulder section, the insertion block being inlaid in a hole formed on the restriction plate.

11. The transmission device applied to pivot shaft mechanism as claimed in claim 3, wherein the drive section is a tubular body having a shaft hole in which the at least one rotary shaft is fitted, the driving section being formed on a surface of the drive section, the driving section being a groove structure including a straight section and an oblique section connected with the straight section.

12. The transmission device applied to pivot shaft mechanism as claimed in claim 11, wherein the driver is formed with an arched section corresponding to the tubular body of the drive section, the guide section being disposed on the arched section, the guide section having the form of a key, the guide section being inlaid in the driving section.

13. The transmission device applied to pivot shaft mechanism as claimed in claim 2, wherein the elastic body is a spiral spring, the hand section and the arm section of the reciprocally movable driver together define an L-shaped contour, the carrier body being disposed on an apparatus body module of an electronic apparatus.

14. The transmission device applied to pivot shaft mechanism as claimed in claim 13, wherein the drive section is a tubular body having a shaft hole in which the at least one rotary shaft is fitted, the driving section being formed on a surface of the drive section, the driving section being a groove structure including a straight section and an oblique section connected with the straight section.

15. The transmission device applied to pivot shaft mechanism as claimed in claim 2, wherein one of the boss and the first end of the turning unit extends the elastic body, an allowable extension range of the elastic body being larger than a moving length by which the first end of the turning unit moves along the guide rail.

16. The transmission device applied to pivot shaft mechanism as claimed in claim 15, wherein the drive section is a tubular body having a shaft hole in which the at least one rotary shaft is fitted, the driving section being formed on a surface of the drive section, the driving section being a groove structure including a straight section and an oblique section connected with the straight section.

17. The transmission device applied to pivot shaft mechanism as claimed in claim 16, wherein the driver is formed with an arched section corresponding to the tubular body of the drive section, the guide section being disposed on the arched section, the guide section having the form of a key, the guide section being inlaid in the driving section.

18. The transmission device applied to pivot shaft mechanism as claimed in claim 2, wherein the rotary shaft is disposed on an electronic apparatus, the electronic apparatus including an apparatus body module and a display module, the fixing plate being disposed on the apparatus body module, the rotary shaft including a first rotary shaft and a second rotary shaft, the fixed section of the first rotary shaft being connected with and disposed on the fixing plate of the apparatus body module, the fixed section of the second rotary shaft being connected with and disposed on the display module, the drive section being disposed on the first rotary shaft, the first and second rotary shafts being enclosed in a subsidiary case, the subsidiary case together with a restriction plate and torque modules being installed in a case, the restriction plate being formed with two holes for the pivoted sections of the first and second rotary shafts to pass through respectively.

19. The transmission device applied to pivot shaft mechanism as claimed in claim 18, wherein a link unit is disposed between the first and second rotary shafts for synchronously rotating the first and second rotary shafts, a section of each of the first and second rotary shafts in adjacency to the pivoted section being formed with a spiral groove, protrusion sections being disposed at two ends of the link unit corresponding to the spiral grooves, the protrusion sections being respectively inlaid in the spiral grooves.

20. The transmission device applied to pivot shaft mechanism as claimed in claim 19, wherein the drive section is a tubular body having a shaft hole in which the first rotary shaft is fitted, the driving section being formed on a surface of the drive section, the driving section being a groove structure including a straight section and an oblique section connected with the straight section, one end of the drive section being provided with a shoulder section and an insertion block formed on the shoulder section, the insertion block being inlaid in a hole formed on the restriction plate.

21. The transmission device applied to pivot shaft mechanism as claimed in claim 20, wherein the driver is formed with an arched section corresponding to the tubular body of the drive section, the guide section being disposed on the arched section, the guide section having the form of a key, the guide section being inlaid in the driving section.

22. The transmission device applied to pivot shaft mechanism as claimed in claim 18, wherein the drive section is a tubular body having a shaft hole in which the first rotary shaft is fitted, the driving section being formed on a surface of the drive section, the driving section being a groove structure including a straight section and an oblique section connected with the straight section, one end of the drive section being provided with a shoulder section and an insertion block formed on the shoulder section, the insertion block being inlaid in a hole formed on the restriction plate.

23. The transmission device applied to pivot shaft mechanism as claimed in claim 22, wherein the driver is formed with an arched section corresponding to the tubular body of the drive section, the guide section being disposed on the arched section, the guide section having the form of a key, the guide section being inlaid in the driving section.

24. The transmission device applied to pivot shaft mechanism as claimed in claim 2, wherein the drive section is a tubular body having a shaft hole in which the at least one rotary shaft is fitted, the driving section being formed on a surface of the drive section, the driving section being a groove structure including a straight section and an oblique section connected with the straight section.

25. The transmission device applied to pivot shaft mechanism as claimed in claim 24, wherein the driver is formed with an arched section corresponding to the tubular body of the drive section, the guide section being disposed on the arched section, the guide section having the form of a key, the guide section being inlaid in the driving section.

26. The transmission device applied to pivot shaft mechanism as claimed in claim 1, wherein the elastic body is a spiral spring, the hand section and the arm section of the reciprocally movable driver together define an L-shaped contour, the carrier body being disposed on an apparatus body module of an electronic apparatus.

27. The transmission device applied to pivot shaft mechanism as claimed in claim 26, wherein the drive section is a tubular body having a shaft hole in which the at least one rotary shaft is fitted, the driving section being formed on a surface of the drive section, the driving section being a groove structure including a straight section and an oblique section connected with the straight section.

28. The transmission device applied to pivot shaft mechanism as claimed in claim 27, wherein the driver is formed with an arched section corresponding to the tubular body of the drive section, the guide section being disposed on the arched section, the guide section having the form of a key, the guide section being inlaid in the driving section.

* * * * *